(12) United States Patent
Yang et al.

(10) Patent No.: US 7,989,252 B2
(45) Date of Patent: Aug. 2, 2011

(54) METHOD FOR FABRICATING PIXEL CELL OF CMOS IMAGE SENSOR (75) Inventors: Jianping Yang, Shanghai (CN);
Jieguang Huo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 165 days.

(21) Appl. No.: 11/871,121

(22) Filed: Oct. 11, 2007

(65) Prior Publication Data
US 2008/0145963 A1 Jun. 19, 2008

(30) Foreign Application Priority Data

Dec. 15, 2006 (CN) .......................... 2006 1 0147318

(51) Int. Cl.
*H01L 21/00* (2006.01)
*H01L 21/8234* (2006.01)
(52) U.S. Cl. .............. 438/57; 438/48; 438/60; 438/200; 438/237; 438/238
(58) Field of Classification Search .................... 438/48, 438/57, 60, 200, 210, 237, 238
See application file for complete search history.

(56) References Cited

U.S. PATENT DOCUMENTS

| 4,758,525 | A | * | 7/1988 | Kida et al. | 438/57 |
| 5,424,222 | A | * | 6/1995 | Arndt | 438/57 |
| 6,221,686 | B1 | * | 4/2001 | Drowley et al. | 438/57 |
| 6,329,233 | B1 | * | 12/2001 | Pan et al. | 438/199 |
| 7,312,098 | B2 | * | 12/2007 | Kimura | 438/75 |
| 7,449,737 | B2 | * | 11/2008 | Lenoble et al. | 257/292 |
| 2002/0197758 | A1 | * | 12/2002 | Chen et al. | 438/48 |
| 2005/0280054 | A1 | * | 12/2005 | Park et al. | 257/290 |
| 2007/0020796 | A1 | * | 1/2007 | Park | 438/57 |
| 2007/0267666 | A1 | * | 11/2007 | Park et al. | 257/292 |

* cited by examiner

*Primary Examiner* — Michael S Lebentritt
*Assistant Examiner* — Karen M Kusumakar
(74) *Attorney, Agent, or Firm* — Squire, Sanders & Dempsey (US) LLP (57) ABSTRACT

The present invention provides a method for fabricating a pixel cell of CMOS image sensor, comprising: preparing a semiconductor substrate divided into region I and region II; forming an insulation layer on the surface of the semiconductor substrate in the region I and a gate dielectric layer on the surface of the semiconductor substrate in the region II; forming a poly-silicon gate on the surface of the semiconductor substrate in the region II; forming a deep doped well in the region I through an ion implantation with high energy; performing an ion implantation with low energy in the region I and an ion implantation for lightly doped source/drain in the region II simultaneously; and forming source/drain regions in the semiconductor substrate in the region II.

11 Claims, 8 Drawing Sheets

METHOD FOR FABRICATING PIXEL CELL OF CMOS IMAGE SENSOR

This application claims the priority of Chinese Patent Application No. 200610147318.8, filed Dec. 15, 2006, the entire disclosure of which is incorporated herein by reference.

FIELD OF THE INVENTION

The present invention relates to the field of semiconductor technologies, and in particular to a method for fabricating a pixel cell of CMOS image sensor.

BACKGROUND OF THE INVENTION

Currently, CCD (Charge Coupled Device) is a primary solid image sensor device, and has advantages of low noise, large dynamic response range, high sensitiveness, etc. However, the CCD is disadvantageous due to its poor compatibility with dominant CMOS (Complementary Metal Oxide Semiconductor) technologies, that is, it is difficult to integrate CCD-based image sensor in a single chip. Due to the use of same CMOS technologies, CIS (COMS Image Sensor) can integrate array of pixels with peripheral circuit into a single chip. In comparison with the CCD, the CIS has advantages of small volume, light weight, low power consummation, easy programming and control, low cost, etc.

Dark current is one of the factors strongly influencing the CIS performance. For a semiconductor device, electron and hole are in a dynamic balance of generation, migration and combination at a temperature higher than absolute zero. The higher the temperature is, the higher the rate at which the electron and hole are generated and migrated is, and the larger the dark current is. Generally, the dark current is an amount of current released by photodiode without incident light, and it shall be zero for an ideal image sensor. However, the photodiode in each pixel acts as capacitor also, and when the capacitor releases charges slowly, a voltage of the dark current may be equivalent to the output voltage under weak incident light even without incident light. Consequently in such a case, an "image" on display can still be observed due to the release of charges accumulated by the capacitor. Therefore, how to optimize the fabrication of photodiode to reduce the dark current of CIS becomes a primary issue confronted by those skilled in the art.

The dark current may be increased by the following two reasons. One is a current formed by moveable charges on surface of the photodiode region, and the other is a damage to the surface of the photodiode region due to plasma etching process for forming poly-silicon gate and sidewall of MOS transistor; and the damage influences crystal structure of the surface on the semiconductor, and further influences the rate at which electron and hole are generated and migrated on the surface of the photodiode region, thus increasing the dark current of CIS.

Figure 1:
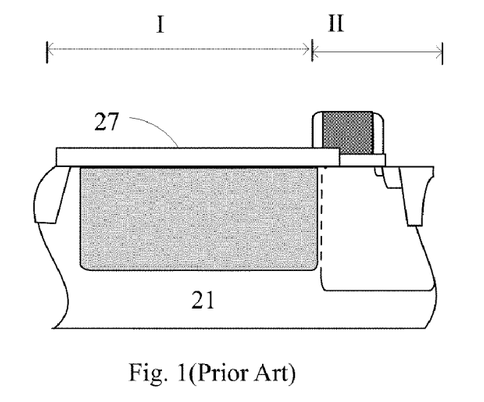
FIG. 1 illustrates a schematic structural diagram of CMOS image sensor in the prior art.

As disclosed in Chinese Patent Application No. 200610030016, an oxide layer is formed on a semiconductor substrate to prevent plasma etching from damaging the surface of the semiconductor substrate. Referring to FIG. 1, an oxide layer 27 is formed in a region I of semiconductor substrate 21, i.e. a photodiode region, so that the damage to the surface of the semiconductor substrate 21 by the plasma etching can be reduced. Meanwhile, a good interface between the oxide layer 27 and the semiconductor substrate 21 can be realized to eliminate some charges at the interface of the semiconductor substrate. Unfortunately, a mask has to be added to form the oxide layer 27 in the photodiode region according to this patent application, thus increasing process cost.

Figure 2:
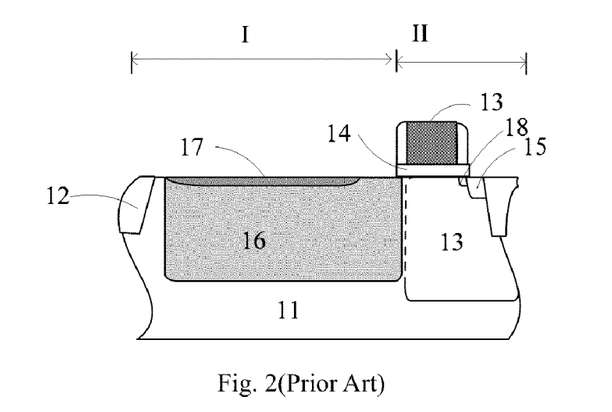
FIG. 2 illustrates a schematic structural diagram of another CMOS image sensor in the prior art.

As disclosed in U.S. Pat. No. 6,514,785, the dark current is reduced by pinning the surface of the photodiode. FIG. 2 is a diagram illustrating a structural of the pixel cell in CMOS image sensor formed in the prior art. Referring to FIG. 2, a semiconductor substrate 11 of, for example, p-type silicon, is divided into two regions: region I (photodiode region) and region II (MOS transistor region); a gate dielectric layer 14 is formed in the region II of the semiconductor substrate 11; a poly-silicon gate 13 is formed on the gate dielectric layer 14; lightly doped source/drain extension regions 18 are formed at both sides of the poly-silicon gate 13 in the region II of the semiconductor substrate 11; source/drain regions 15 are formed at both sides of the poly-silicon gate 13 in the region II of the semiconductor substrate 11; a deep doped n-type well 16 of the photodiode is formed in the region I of the semiconductor substrate 11, where the deep-doped n-type well 16 and the semiconductor substrate 11 constitute a PN junction forming the photodiode; a shallow doped p-type region 17 is formed in the region I of the semiconductor substrate 11 by ion implantation process, where the shallow doped p-type region 17 and the deep doped n-type well 16 of the photodiode constitute a PN junction forming a second diode; and PIN layer is formed on the surface of the semiconductor substrate 11 to pin moveable charges on the surface of the semiconductor substrate 11, thus reducing the dark current. Also the formation of the second diode requires an additional mask, resulting in an increased process cost.

The two methods mentioned above provide solutions for preventing the damage to the surface of the semiconductor substrate 21 caused by plasma etching and for pinning moveable charges on the surface of the semiconductor substrate 11 respectively, however, both of them require an additional mask. Integration of the solutions enables both reduction of the damage to the surface of the semiconductor substrate 211 caused by plasma etching and pinning of moveable charges on the surface of the semiconductor substrate 11, but two additional mask have to be added, thus increasing process steps and cost.

SUMMARY OF THE INVENTION

The invention has been made in view of the following fact in the prior art. During fabricating the CMOS image sensor, two diodes are formed in the region I of the pixel cell, i.e. the photodiode region, by forming a deep doped well through ion implantation with high energy and forming a shallow doped region through ion implantation with low energy. The deep doped well and the semiconductor substrate constitute the photodiode, and the shallow doped region and the deep doped well constitute the second diode. Next an insulation layer is formed in the shallow doped region. Wherein, an additional mask is used in the process for forming the shallow doped region, thus increasing the process steps and the process cost.

An embodiment of the invention provides a method for fabricating pixel cell of CMOS image sensor, including: preparing a semiconductor substrate divided into a region I and a region II; forming an insulation layer on the surface of the semiconductor substrate in the region I, and a gate dielectric layer on the surface of the semiconductor substrate in the region II; forming a poly-silicon gate on the surface of the semiconductor substrate in the region II; forming a deep doped well in the region I through ion implantation with high energy; performing ion implantation with low energy in the region I and ion implantation for lightly doped source/drain in the region II simultaneously; and forming source/drain regions in the semiconductor substrate in the region II.

Preferably, the semiconductor substrate may be p-type.

Preferably, the ion implantation with high energy is performed with n-type ions, e.g. phosphor ions.

Preferably, the ion implantation with high energy may be performed with an energy ranging from 100 to 400 KeV and a dosage ranging from 1.0E+12 to 1.0E+13 cm$^{-2}$.

Preferably, a peak of concentration of the ion implantation with low energy may be in the insulation layer.

Preferably, the ion implantation with low energy may be performed with boron ions.

Preferably, the ion implantation with low energy and the ion implantation for lightly doped source/drain may be performed with an energy ranging from 5 to 15 KeV and a dosage ranging from 2.0E+12 to 1.2E+13 cm$^{-2}$.

Preferably, the insulation layer may be in thickness ranging from 10 to 100 nm.

Preferably, the insulation layer may be made of silicon oxide, silicon oxynitride or a combination thereof.

Preferably, the insulation layer may be formed by oxidation or chemical vapor deposition.

The embodiments of the invention are advantageous at least in the followings. During forming the pixel cell of the CMOS image sensor, the ion implantations for forming the shallow doped region of the photodiode and for forming the source/drain extension regions of the MOS transistor are performed simultaneously, and the one mask can be omitted, thus decreasing the process steps and the process cost. Furthermore, the insulation layer is formed on the photodiode in the pixel cell of the CMOS image sensor for the purpose of preventing the photodiode region from being damaged due to plasma etching during forming the poly-silicon gate and the sidewalls of the MOS transistor. The thickness of the insulation layer on the photodiode region can be adjusted to make the peak concentration of the ion implantation with low energy within the insulation layer, and thus it is possible to prevent the peak concentration from being excessively high and forming a sharp junction at the deep doped well, and hence to prevent the leakage current.

DETAILED DESCRIPTION OF THE EMBODIMENTS

The essence of embodiments of the invention is to perform an ion implantation with low energy for forming a shallow doped region on a surface of photodiode region and an ion implantation for forming a lightly doped source/drain with the same mask simultaneously during forming a pixel cell of CMOS image sensor, thus reducing process steps and cost. In an embodiment of the invention, a semiconductor substrate of p-type silicon is used. A deep n-type doped well is formed through an ion implantation with high energy, and it constitutes a photodiode together with the p-type silicon. Then, the shallow doped region is formed through an ion implantation with low energy, which is performed simultaneously with the ion implantation for lightly doped source/drain of an MOS transistor. It shall be appreciated that the invention will not be limited to this. For instance, the semiconductor substrate can also be n-type, where a deep p-type doped well can be formed through an ion implantation with high energy, and then a shallow n-type doped region can be formed.

Figure 3A:
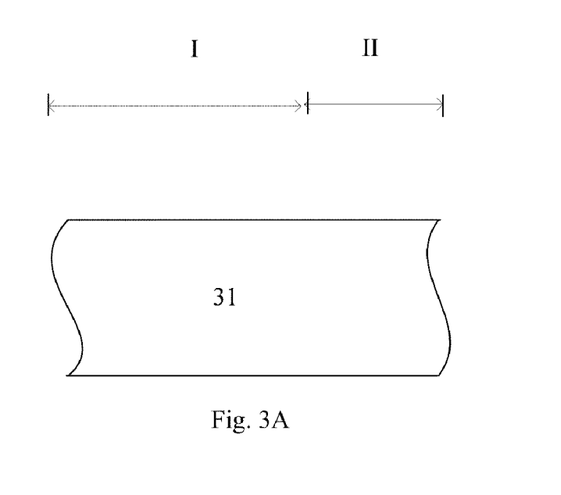
FIG. 3A to FIG. 3M illustrate schematic structural diagrams of forming CMOS image sensor according to an embodiment of the invention.

Referring to FIG. 3A, a semiconductor substrate 31 is prepared. The semiconductor substrate is divided into region I, i.e. a photodiode region, and region II, i.e. an MOS transistor region. The MOS transistor region may include a plurality of MOS transistors, although only one MOS transistor is shown here. Source/drain regions of the MOS transistor are adjacent to a deep doped well of the photodiode region, that is, a cathode of photodiode is electrically connected with the source region or the drain region of the MOS transistor.

Figure 3B:
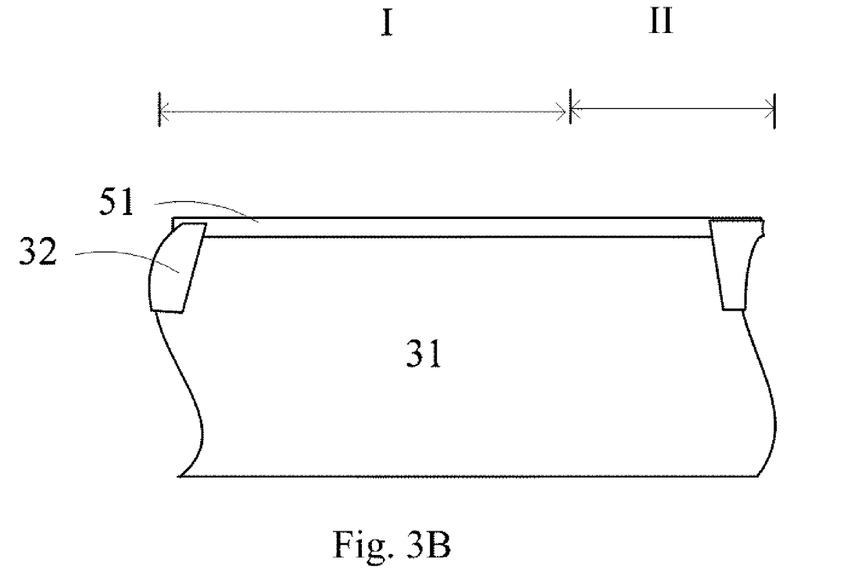

Referring to FIG. 3B, a shallow trench 32 is formed on the semiconductor substrate 31 by a process well known to those skilled in the art. In a preferred embodiment of the invention, a first oxide layer with a thickness of 100 Å is grown on the semiconductor substrate 31; a silicon nitride layer with thickness of 350 Å is formed on the first oxide layer; an active region is defined through photolithography using photoresist; the silicon nitride layer and the first oxide layer are etched; the semiconductor substrate 31 is etched by 5000 Å to form a trench; the photoresist is removed; a second silicon oxide layer with a thickness of 100 Å is formed on the semiconductor substrate 31; the trench is filled with silicon oxide with a thickness of 5500 Å through HDP-CVD (High Density Plasma-Chemical Vapor Deposition); then RTA (Rapid Thermal Annealing) is performed at 1000° C. for 20 seconds to enhance adhesion between HDP silicon oxide and the semiconductor substrate 31; and a planarization process is performed using CMP (Chemical Mechanical Polishing) method, thus the shallow trench 32 is formed. In a way well known to those skilled in the art, a third oxide layer 51 is formed on the semiconductor substrate 31 for protecting the surface of the semiconductor substrate 31 during a subsequent process for forming an n-well or p-well. In an embodiment of the invention, the third oxide layer 51 with a thickness of 100 Å is formed on the semiconductor substrate 31.

Figure 3C:
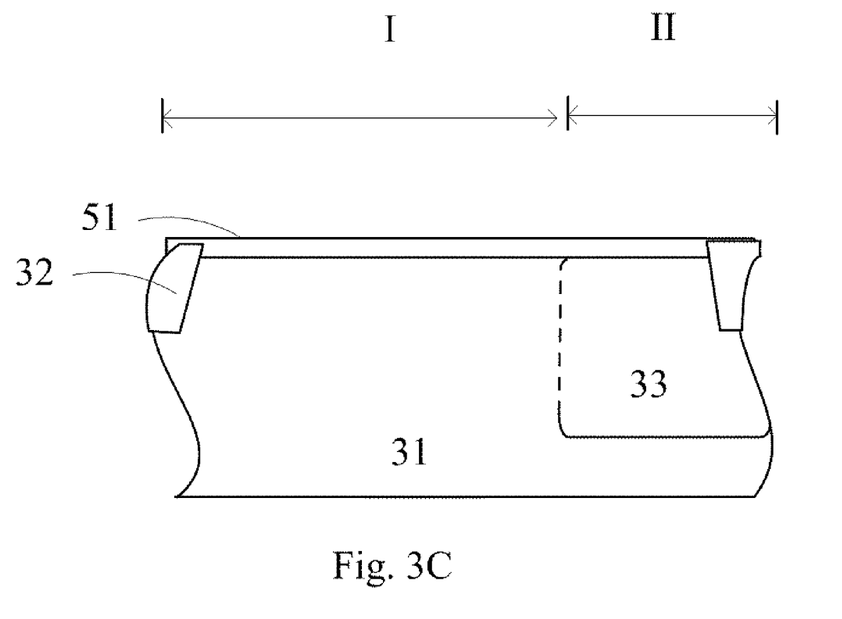

Referring to FIG. 3C, a p-well 33 is formed in the region II of the semiconductor substrate 31. In an embodiment of the invention, using the p-well mask, the p-well 33 is formed in the semiconductor substrate 31 through implanting B (Boron) ions with an energy ranging from 400 to 800 KeV and a dosage ranging from 1.0E+13 to 6.0E+13 cm$^{-2}$, and accordingly with an implantation depth ranging from 300 to 500 nm, preferably with an energy of 600 KeV and a dosage of 2.0E+13 cm$^{-2}$.

Subsequently, RTA is performed in order to diffuse the implanted ions uniformly. In an embodiment of the invention, RTA is performed at 1050° C. for 30 seconds.

Figure 3D:
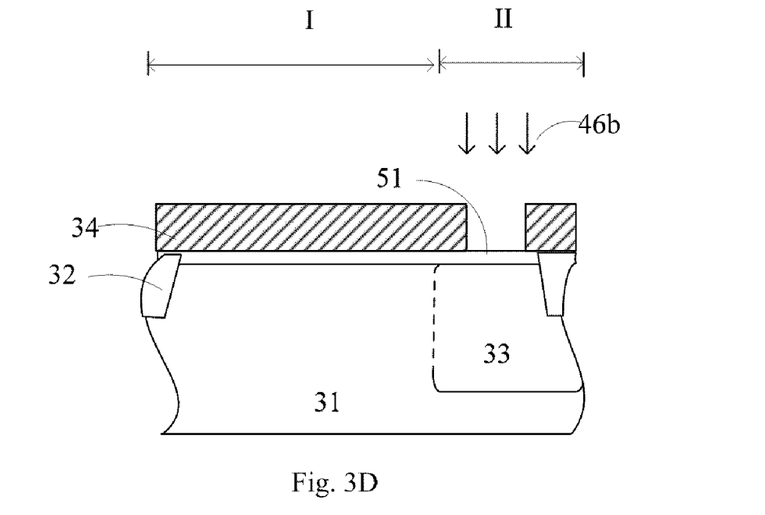

Referring to FIG. 3D, an ion implantation 46b is performed in the region II of the semiconductor substrate 31, i.e. the p-well 33, so as to adjust threshold voltage of an MOS transistor formed thereon. Specifically, photoresist 34 is formed on the third oxide layer 51 on the semiconductor substrate 31, a region where a gate of the MOS transistor is formed is defined through photolithography, and then the ion implantation 46b is performed at that region. In an embodiment of the invention, the ion implantation 46b is performed with B$^+$, an energy ranging from 20 to 80 KeV and a dosage ranging from 1.0E+13 to 5.0E+13 cm$^{-2}$, preferably with an energy of 40 KeV and a dosage of 3.0E+13 cm$^{-2}$.

Figure 3E:
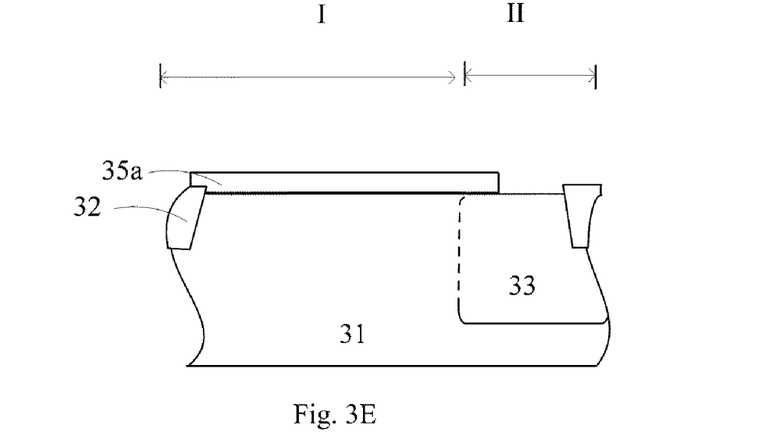

Referring to FIG. 3E, the third oxide layer 51 on the surface of the semiconductor substrate 31 is removed, a first dielectric layer is formed on the regions I and II of the semiconductor substrate 31, and the first dielectric layer on the region II of the semiconductor substrate 31 is removed through conventional photolithography and etching method while remaining the first dielectric layer 35a on the region I. The first dielectric layer 35a is made of silicon oxide, silicon nitride or a combination thereof. In an embodiment of the invention, the first dielectric layer 35a is made of silicon oxide, and preferably, can be formed with a thickness of 180 Å through thermal oxidization.

Figure 3F:
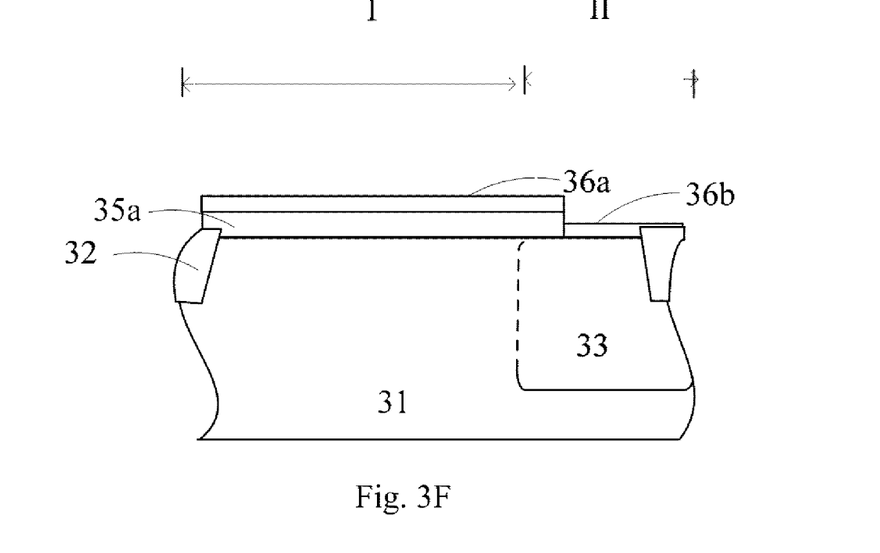

Referring to 3F, a second dielectric layer 36a and a second dielectric layer 36b, made of silicon oxide, silicon nitride or a combination thereof, are formed on the regions I and II of the semiconductor substrate 31 respectively. In an embodiment of the invention, the second dielectric layers 36a and 36b are made of silicon oxide, and preferably, can be formed with a thickness of 50 Å through thermal oxidization.

Figure 3G:
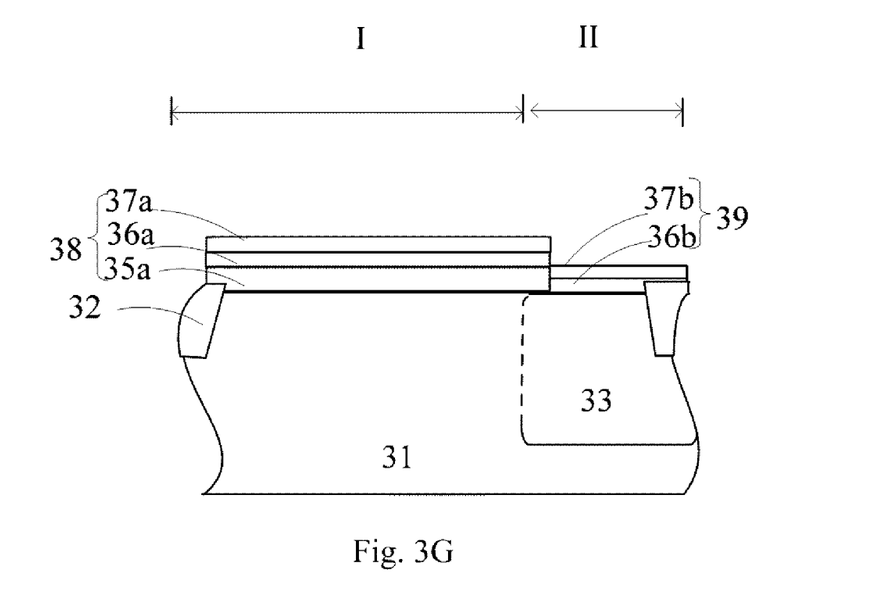

Referring to FIG. 3G, a third dielectric layer 37a and a third dielectric layer 37b are formed on the second dielectric layers 36a and 36b in the region I respectively. The third dielectric layers 37a and 37b are necessary for peripheral circuit of a pixel cell of the CMOS image sensor, for instance acting as a gate dielectric layer of the peripheral circuit, and are formed with a thickness of 30 Å. The first, second and third dielectric layers 35a, 36a and 37a in the region I together constitute an insulation layer 38 with a thickness ranging from 10 to 100 nm, preferably 250 Å. The good interface between the insulation layer 38 and the semiconductor substrate 31 can eliminate some moveable charges on the surface of the semiconductor substrate 31, thereby suppressing the dark current in the CMOS image sensor. The second and third dielectric layers 36b and 37b in the region II together act as a gate dielectric layer 39 in the MOS transistor region.

Figure 3H:
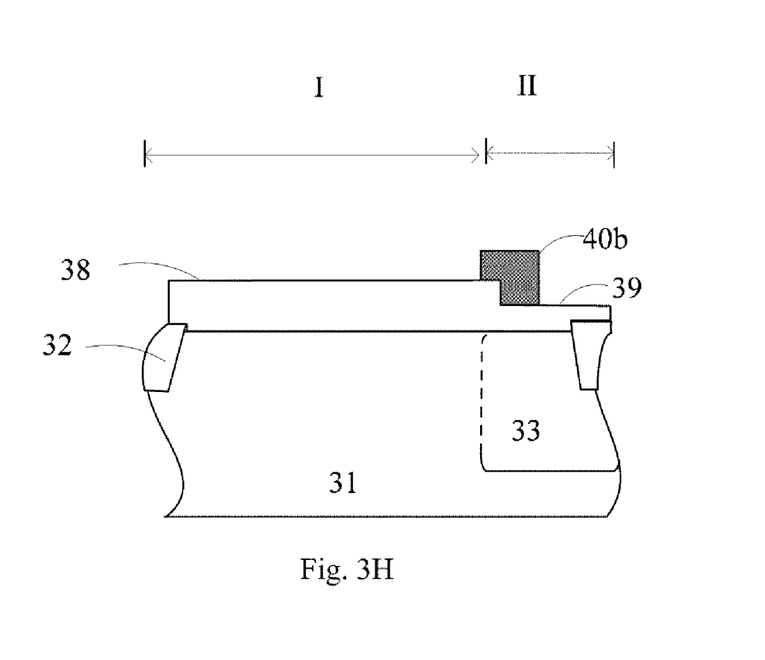

Referring to 3H, a poly-silicon layer is formed in the regions I and II of the semiconductor substrate 31, and the poly-silicon layer on the region I is removed through conventional photolithography and etching process while remaining the poly-silicon layer 40b on the region II. The thickness of poly-silicon gate 40b ranges from 700 to 1500 Å.

Figure 3I:
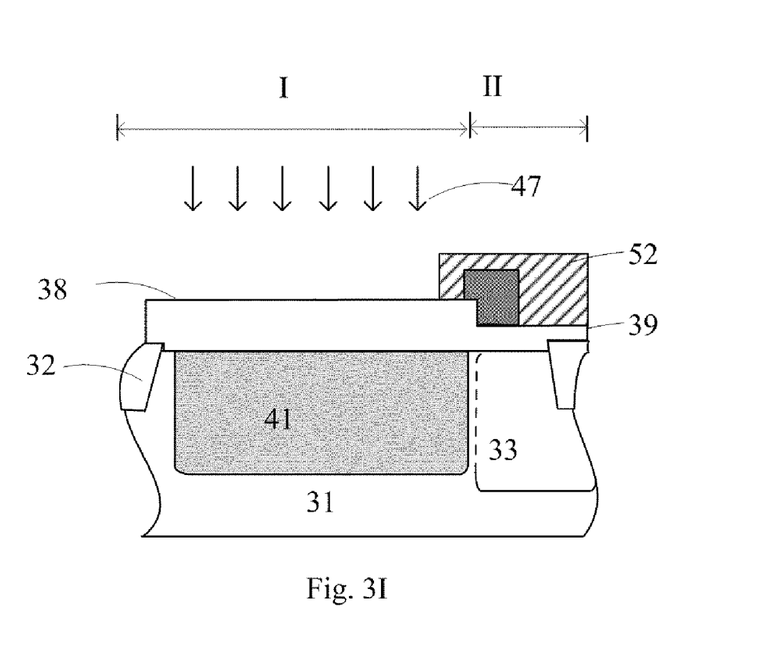

Next referring to 3I, an ion implantation with high energy 47 for a deep doped n-type well 41 of a photodiode is performed in the region I of the semiconductor substrate 31, which is identical to ion implantation 49 subsequently performed for source/drain regions in terms of a type of ions. Specifically, the ion implantation with high energy 47 is performed with photoresist 52 protecting the region II of the semiconductor substrate 31, and then a deep doped well 41 of the photodiode is formed in the photodiode region. Here, the ion implantation with high energy 47 is performed with P (phosphor) ions, implantation energy ranging from 100 to 400 KeV and implantation dosage ranging from 1.0E+12 to 1.0E+13 $cm^{-2}$. A PN junction is formed between the deep doped well 41 of the photodiode and the p-type semiconductor substrate 31, thus forming the photodiode.

Figure 3J:
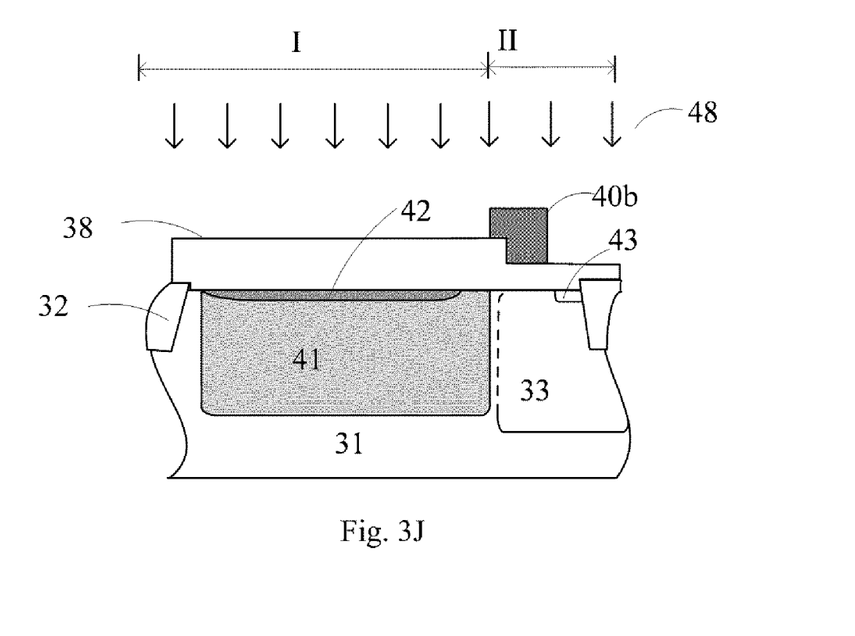

Next referring to FIG. 3J, with the poly-silicon gate 40b as mask, ion implantation 48 for lightly doped source/drain is performed in the semiconductor substrate 31, that is, ion implantation with low energy is performed in the photodiode region at the same time. Then, lightly doped p-type source/drain extension regions 43 are formed in the region II of the semiconductor substrate 31 (i.e. the transistor region) and a shallow p-type doped region 42 is formed in the photodiode region at the same time, wherein the shallow doped region and the deep doped well are different in conductive type. The shallow doped region 42 together with the deep doped well 41 for the photodiode constitutes a PN junction, thus forming a second diode. Consequently, PIN layer is formed on the semiconductor substrate 31 so as to pin moveable charges on the semiconductor substrate 31, thereby suppressing the dark current in the CMOS image sensor. The ion implantation with low energy, i.e. the ion implantation 48 for lightly doped source/drain, is performed with an energy ranging from 5 to 15 KeV and a dosage ranging from 2.0E+12 to 1.2E+13 $cm^{-2}$.

In an embodiment of the invention, the ion implantation with low energy, i.e. the ion implantation 48 for lightly doped source/drain, is performed with an energy of 10 KeV and a dosage of 6.0E+12 $cm^{-2}$, and accordingly with implantation depth of 400 Å. Since the thickness of the insulation layer 38 is 250 Å and peak depth of the ion implantation with low energy is less than 250 Å, that is, the thickness of the insulation layer 38 is larger than or equal to the peak depth of the ion implantation with low energy, the peak of the ion implantation with low energy is in the insulation layer 38. Thus, an abrupt junction can be prevented from being formed between the peak of the implanted ions and the deep doped well 41, thus suppressing the leakage current.

In the embodiments of the invention, the ion implantation with low energy and the ion implantation 48 for lightly doped source/drain are performed simultaneously using the same mask, thus reducing the process steps and the process cost.

Figure 3K:
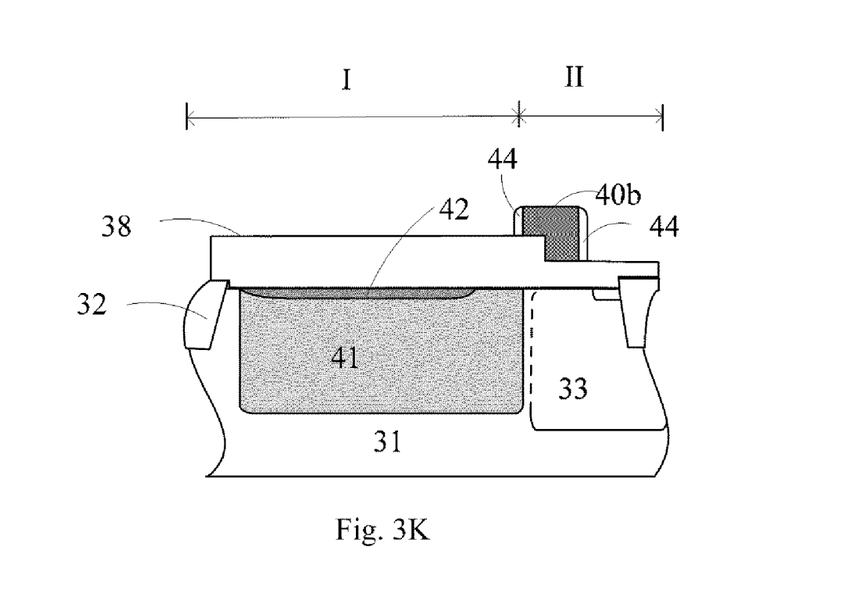

Next referring to FIG. 3K, sidewalls 44 are formed at both sides of the poly-silicon gate 40b on the semiconductor substrate 31 for the purpose of preventing lateral diffusion between source and drain of the transistor formed subsequently. In a preferred embodiment of the invention, a fourth silicon oxide layer is deposited over the semiconductor conductor, then a second silicon nitride layer is deposited, and next a fifth silicon oxide layer is formed. The fourth silicon oxide layer, the second silicon nitride layer and the fifth silicon oxide layer constitute an ONO layer. Then the fifth silicon oxide layer, the second silicon nitride and the fourth silicon oxide are etched sequentially, thus forming the sidewalls 44.

Figure 3L:
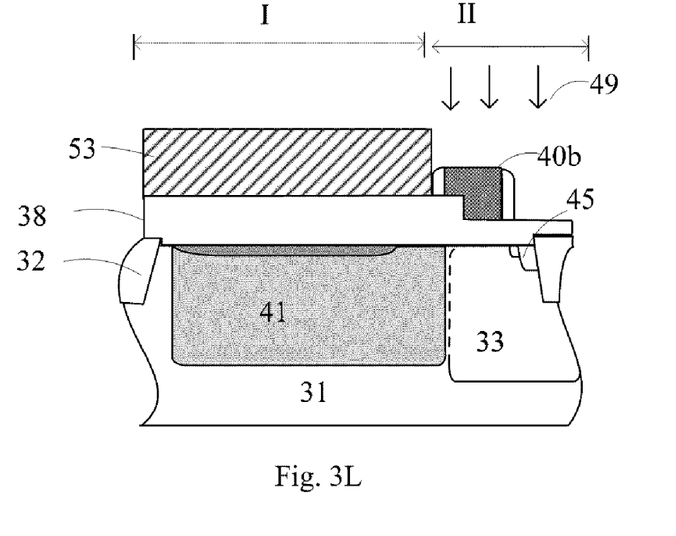

Referring to FIG. 3L, an ion implantation 49 for source/drain regions is performed at both sides of the poly-silicon gate 40b on the semiconductor substrate 31, which is identical to the ion implantation with high energy 47 in terms of the type of ions. Through conventional photolithography process, photoresist 53 is formed over the insulation layer 38, and then the region II is defined. The ion implantation 49 for source/drain regions is performed in the semiconductor substrate 31, thus forming source/drain regions 45 of the transistor. The ion implantation 49 for source/drain regions is performed with n-type ions including P ions, the implantation energy ranging from 5 to 30 KeV and the implantation dosage ranging from 4.0E+14 to 4.0E+15 $cm^{-2}$.

In an embodiment of the invention, the ion implantation 49 for source/drain regions is performed with an energy of 20 KeV and a dosage of 1.0E+15 $cm^{-2}$, thus forming the source/drain regions 45 in the semiconductor substrate 31.

Figure 3M:
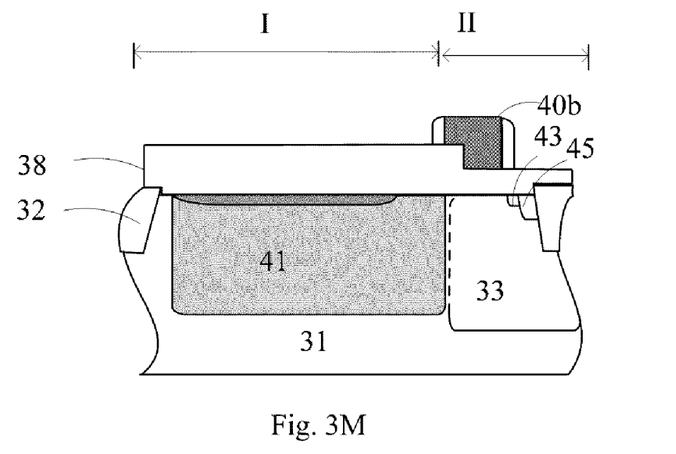

Referring to FIG. 3M, the photoresist 53 is removed by a conventional process.

Next, as it well known to those skilled in the art, metallization, formation of a contact hole, formation of an electrode, etc. are performed sequentially, thereby providing a pixel cell of the CMOS image sensor according to the embodiment of the invention.

Figure 4:
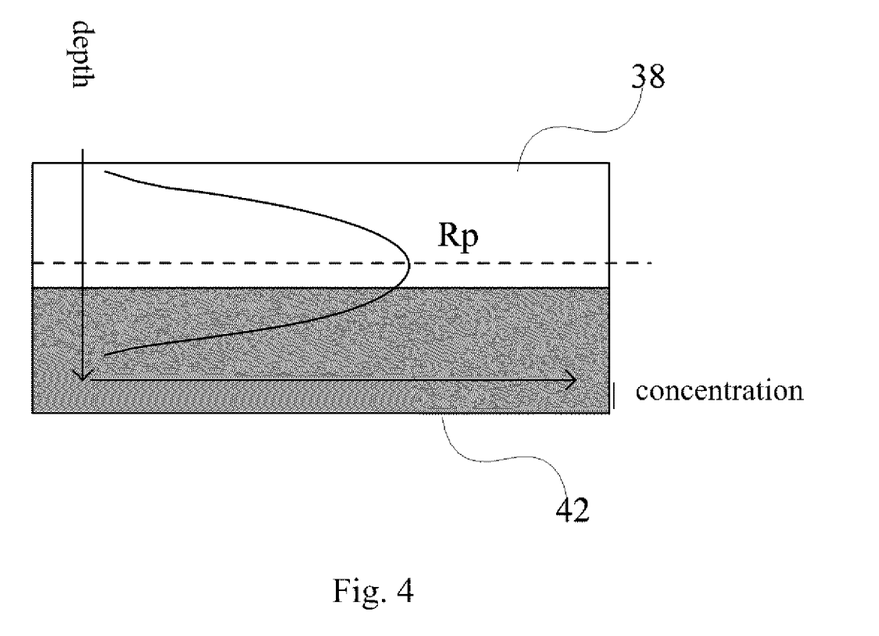
FIG. 4 illustrates a schematic diagram of distribution of concentration of an ion implantation with low energy as a function of depth according to an embodiment of the invention.

FIG. 4 illustrates a schematic diagram of a distribution of the ion implantation concentration with low energy as a function of depth according to an embodiment of the invention. As shown in FIG. 4, the concentration of the ion implantation with low energy takes Gaussian distribution, wherein the concentration of the ion implantation with low energy increases as the implantation depth increases and then decreases as the implantation depth decreases, thus forming a peak concentration Rp of the ion implantation with low energy. In an embodiment of the invention, the thickness of the insulation layer 38 is adjusted in accordance with the energy of the ion implantation 48 for lightly doped source/drain, which is the ion implantation with low energy, so that the peak concentration of the ion implantation with low energy is in the insulation layer 38. While forming the lightly doped source/drain extension regions 43, the shallow doped region 42 is formed by performing the ion implantation with low energy to the surface of the semiconductor substrate 31. Since the PIN layer consists of the shallow doped region 42 and the insulation layer 38 are formed on the surface of the region I of the semiconductor substrate 31, and only one mask is added in the process, it is possible not only to prevent the damage to the surface of the semiconductor substrate 31 due to plasma etching and but also to pin moveable charges on the surface of the semiconductor substrate 31 and hence reduce the dark current in CIS.

The pixel cell of CMOS image sensor fabricated by the above process is illustrated in FIG. 3M. As shown in FIG. 3M, the semiconductor substrate 31 is divided into the regions I and II. The MOS transistor including the lightly doped source/drain extension regions 43 and 45 is formed in the region II of the semiconductor substrate, while the deep doped well 41 and the shallow doped well 42 are formed in the region I, and the shallow doped well 42 is formed simultaneously with the lightly doped source/drain extensions 43.

The present invention has been described and illustrated with reference to the embodiments thereof and the drawings. It shall be obvious to those skilled in the art that those embodiments and drawings are merely illustrative and not restrictive, that the present invention shall not be limited the embodiments disclosed here, and that various modifications and variations can be made thereto in light of the descriptions and the drawings without departing from the spirit and scope of the present invention as defined in the accompanying claims.

What is claimed is:

1. A method for fabricating a pixel cell of CMOS image sensor, comprising:
   preparing a semiconductor substrate divided into region I and region II;
   forming an insulation layer on the surface of the semiconductor substrate in the region I and a gate dielectric layer on the surface of the semiconductor substrate in the region II, wherein the insulation layer is thicker than the gate dielectric layer;
   forming a poly-silicon gate on the surface of the semiconductor substrate in the region II;
   forming a deep doped well in the region I through an ion implantation with high energy;
   performing an ion implantation with low energy in the region I and an ion implantation for lightly doped source/drain in the region II simultaneously, wherein the ion implantation with low energy and the ion implantation with high energy are different in conductive type, and wherein peak concentration of the ion implantation with low energy is in the insulation layer; and
   forming source/drain regions in the semiconductor substrate in the region II.

2. The method for fabricating a pixel cell of CMOS image sensor according to claim 1, wherein the ion implantation with low energy and the ion implantation for lightly doped source/drain use the same mask.

3. The method for fabricating a pixel cell of CMOS image sensor according to claim 1, wherein the semiconductor substrate is p-type.

4. The method for fabricating a pixel cell of CMOS image sensor according to claim 3, wherein the ion implantation with high energy is performed with n-type ions.

5. The method for fabricating a pixel cell of CMOS image sensor according to claim 4, wherein the n-type ions are phosphor ions.

6. The method for fabricating a pixel cell of CMOS image sensor according to claim 5, wherein the ion implantation with high energy is performed with an energy ranging from 100 to 400 KeV and a dosage ranging from 1.0E+12 to 1.0E+13 cm$^{-2}$.

7. The method for fabricating a pixel cell of CMOS image sensor according to claim 3, wherein the ion implantation with low energy is performed with boron ions.

8. The method for fabricating a pixel cell of CMOS image sensor according to claim 7, wherein the ion implantation with low energy and the ion implantation for lightly doped source/drain are performed with an energy ranging from 5 to 15 KeV and a dosage ranging from 2.0E+12 to 1.2E+13 cm$^{-2}$.

9. The method for fabricating a pixel cell of CMOS image sensor according to claim 8, wherein a thickness of the insulation layer ranges from 10 to 100 nm.

10. The method for fabricating a pixel cell of CMOS image sensor according to claim 9, wherein the insulation layer is made of silicon oxide, silicon oxynitride or a combination thereof.

11. The method for fabricating a pixel cell of CMOS image sensor according to claim 10, wherein the insulation layer is formed by oxidation or chemical vapor deposition method.

* * * * *